(12) United States Patent
Williams

(10) Patent No.: US 7,088,970 B2
(45) Date of Patent: Aug. 8, 2006

(54) AMPLIFICATION APPARATUS, SYSTEMS, AND METHODS

(75) Inventor: Percival F Williams, Glos (GB)

(73) Assignee: Halliburton Energy Services, Inc., Houston, TX (US)

( * ) Notice: Subject to any disclaimer, the term of this patent is extended or adjusted under 35 U.S.C. 154(b) by 74 days.

(21) Appl. No.: 10/854,539

(22) Filed: May 26, 2004

(65) Prior Publication Data

US 2005/0264349 A1    Dec. 1, 2005

(51) Int. Cl.
*H01Q 11/12* (2006.01)
(52) U.S. Cl. ...................... 455/127.1; 455/91
(58) Field of Classification Search ............. 455/127.1, 455/127.2, 127.3, 127.4, 127.5, 91; 330/10, 330/251, 207 A, 60
See application file for complete search history.

(56) References Cited

U.S. PATENT DOCUMENTS 6,317,248 B1* 11/2001 Agrawal et al. ............ 359/265
6,449,082 B1* 9/2002 Agrawal et al. ............ 359/275
6,993,302 B1* 1/2006 Bausov et al. ............ 455/127.1

OTHER PUBLICATIONS

Honda, Jun , et al., "Class D Audio Amplifier Design", *International Rectifier, Class D Audio Tutorial,* (Oct. 8, 2003),1-54.

* cited by examiner

*Primary Examiner*—Henry Choe
(74) *Attorney, Agent, or Firm*—Schwegman, Lundberg, Woessner & Kluth, P.A.

(57) ABSTRACT

In some embodiments, an apparatus and a system, as well as a method and an article, may include receiving a received signal, such as a substantially sinusoidal signal, provided by a driven element, such as a magnetostrictive device, coupled to a non-atmospheric medium and an amplifier having substantially zero quiescent current in the absence of an input signal, wherein the amplifier is to receive a pulse modulated wave comprising an original signal substantially similar to the received signal.

28 Claims, 3 Drawing Sheets

AMPLIFICATION APPARATUS, SYSTEMS, AND METHODS

TECHNICAL FIELD

Various embodiments described herein relate to electrical circuitry generally, including apparatus, systems, and methods for transmitting and receiving signals.

BACKGROUND INFORMATION

Downhole tools used in the oil and gas industry may include circuitry that operates to transmit and receive electrical signals. In many cases, these signals are amplified to fulfill various design goals. Sometimes the amplification circuitry is battery-powered, and/or used in high-temperature environments, so that minimal power consumption is a desired goal. However, even when certain low-power amplification devices are used, such as the Burr-Brown OPA541 operational amplifier, quiescent currents of 20 milliamperes and more may exist. Thus, power is consumed even when no signal is present at the input, such as when the signal to be amplified includes a pulse or square-wave. Therefore, additional circuitry may be needed to switch off the supply when no input signal is applied in order to achieve the level of power saving desired. Such designs may present additional challenges including the need to accommodate physical heat-sinks, and dual-voltage supplies.

DETAILED DESCRIPTION

In some embodiments of the invention, the challenges described above may be addressed by providing an apparatus having an amplifier characterized by substantially zero quiescent current in the absence of an input signal (e.g., a Class-D amplifier). The amplifier may be designed to receive a pulse modulated wave comprising a representation of an original signal (e.g., the original signal may comprise a substantially sinusoidal signal, perhaps in the frequency range of about 20 Hertz to about 20,000 Hertz). In some embodiments, the pulse modulated wave may include a pulsed signal of about 2,000 Hertz, with a burst length of about 200 milliseconds.

The amplifier may be used to drive a driven element, such as a magnetostrictive transducer, coupled to a non-atmospheric medium (e.g., a mud motor). The non-atmospheric medium, in turn, may operate to filter and propagate a signal, which upon receipt, is found to be substantially similar to the original signal. Thus, the non-atmospheric medium may act as a filter, providing a substantially sinusoidal signal that can be tracked by a phase-locked loop (PLL), perhaps included in a receiver. In some embodiments, the amplifier input can be operated with a square wave signal.

Figure 1:
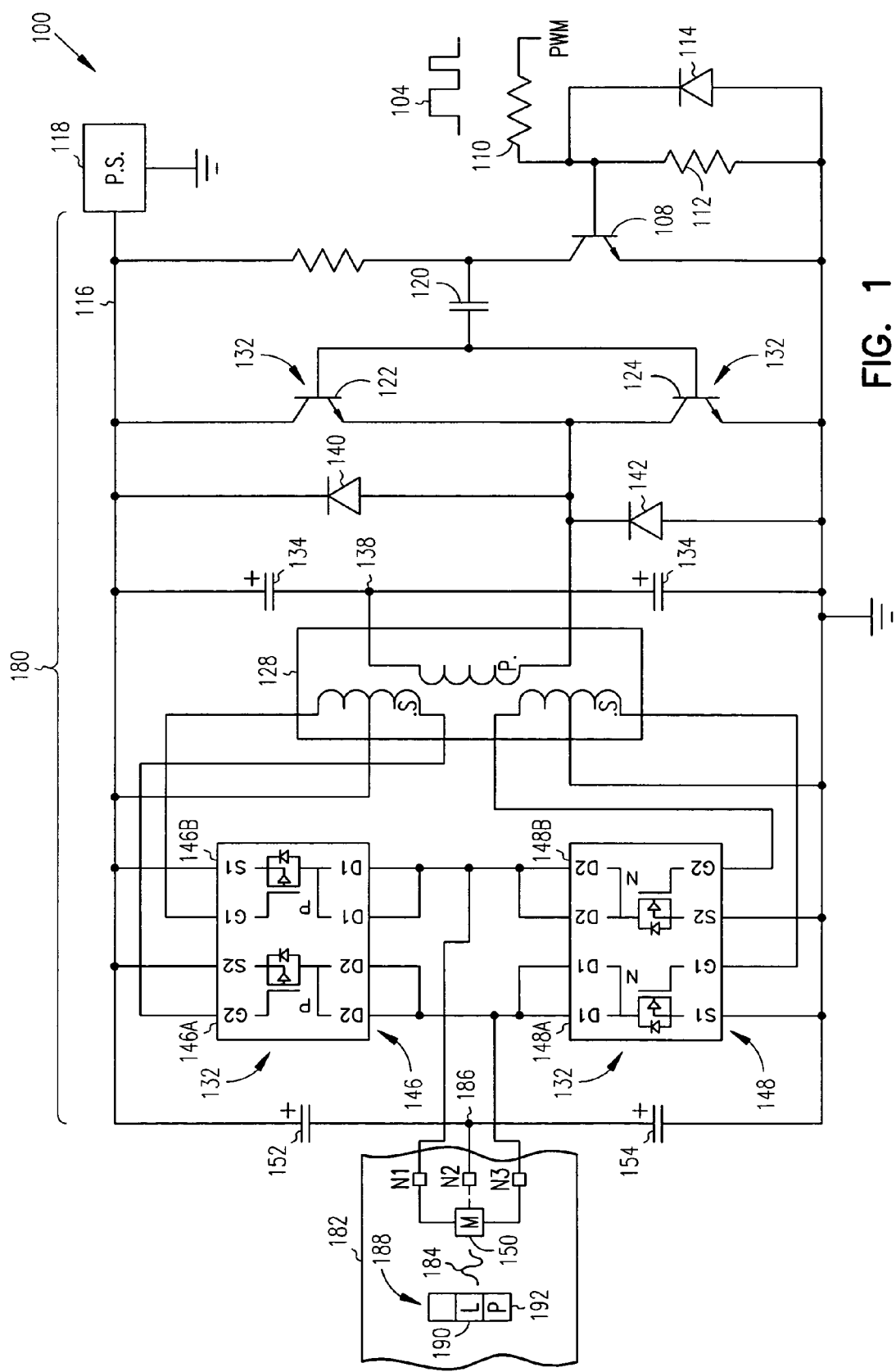
FIG. 1 is a schematic diagram of an apparatus according to various embodiments.

FIG. 1 is a schematic diagram of an apparatus 100 according to various embodiments which may operate in the manner previously described. For example, it may be assumed that an input waveform 104, which in some embodiments comprises a pulse-width modulated (PWM) signal (i.e., a pulse modulated wave), perhaps made available in the form of a 5 volt logic signal. This input waveform 104 can be applied to the base of a transistor 108 via the resistor 110 in order to limit the current into the base of the transistor 108. The resistor 112 may be included to offset existing input capacitance and to assist in switching off the transistor 108. The diode 114 may be included to reduce negative excursions of the input waveform 104 (e.g., in the event that the input signal is an AC (alternating current) signal coupled from the source of the signal generator). If available as a 5 volt logic signal, the input waveform 104 may be converted into a waveform which transitions between 0 volts and +22 volts at the collector of the transistor 108, which may be a fast NPN transistor (i.e., the transistor 108 may switch relatively rapidly). Of course, those of skill in the art will realize that the input waveform does not have to be a 5 volt logic signal, and the excursions at the collector of the transistor 108 may be other than about 0 volts to about +22 volts, depending on the applied supply voltage 116. A power supply 118, which may comprise a single-voltage supply, can be used to provide the supply voltage 116 to the apparatus 100.

The signal on the collector of the transistor 108 may be AC-coupled via capacitor 120 to various switching devices 132, such as to the bases of transistors 122 and 124, which may comprise a complementary pair of transistors connected as an emitter-follower. In some embodiments, the transistors 122 and 124 may switch relatively slowly. The emitters of the transistors 122 and 124 may be connected to the primary winding of a transformer 128, which may in turn be used to drive one or more switching devices 132, such as one or more MOSFETs (metal-oxide field-effect transistors) 146a, 146b, 148a, 148b.

The return for the primary winding may be made to the junction of a pair of capacitors 134 connected across the power supply 118. These capacitors 134 can perform multiple functions. For example, they may operate to smooth the supply voltage 116, and they may provide a pseudo ground 138 for the transformer 128 primary winding. For the purposes of this document, a "pseudo ground" refers to a junction between two components connected in series across a power supply, such as the capacitors 134 connected between power supply 118 and ground.

The transformer 128, in turn, may drive one or more switching devices 132. The diodes 140, 142 may operate to protect the transistors 122, 124 against back EMF (electromotive force) emanating from the transformer 128.

The driven switching devices 132 may comprise a dual P-channel MOSFET 146, perhaps packaged in an SO-8 (small outline, 8 lead) package. The driven switching devices 132 may also comprise the complement of a dual P-channel MOSFET, such as a dual N-channel MOSFET 148. The gates of the MOSFETs 146a, 146b, 148a, 148b included in the driven switching devices 132 may be connected to their respective sources through secondary windings of the transformer 128. This arrangement may help ensure that the MOSFETs 146a, 146b, 148a, 148b are in the non-conducting, fail-safe state when no drive signal is present.

Given the connections shown, the quiescent current within the apparatus 100 may thus be substantially zero, since in the absence of an input waveform to drive transistor 108, transistors 108, 122, and 124 are all turned OFF. Providing a drive signal (e.g., applying the input waveform 104 to the transistor 108) may cause diagonally opposite pairs of switching devices 132 (e.g., MOSFET 148a and MOSFET 146b or MOSFET 148b and MOSFET 146a) to either conduct or not conduct. That is, when one pair of diagonally opposite pairs of devices 132 (e.g., MOSFET 148a and MOSFET 146b) are conducting, the other pair of devices 132 (e.g., MOSFET 148b and MOSFET 146a) are non-conducting.

The switching devices 132 can be used in an H-bridge configuration by connecting a driven element 150, such as an inductor and/or magnetostrictive sensor, between nodes N1 and N3. For a non H-bridge connection, the driven element 150 may be connected between nodes N2 and either N1 or N3. Such a variety of connection options provides the capability of two operating power levels. In the case of non H-bridge operation, capacitors 152, 154 can provide a pseudo ground 186, as well as assisting in smoothing the supply voltage 116. Intrinsic diodes within the MOSFETs (e.g., D1 and D2) may operate to absorb back EMF from the driven element 150.

Thus, in some embodiments, an apparatus 100 may comprise an amplifier 180 having substantially zero quiescent current in the absence of an input signal to receive an input waveform 104, such as a pulse modulated wave comprising a representation of some desired original signal. The amplifier 180 may be used to drive a driven element 150, which may be coupled to a medium 182, perhaps comprising a non-atmospheric medium (e.g., a mud motor or drill string), that filters and propagates a signal 184, including a received signal, that is substantially similar to the desired original signal. For example, the desired original signal may comprise a substantially sinusoidal signal that can be transformed into the input waveform 104, perhaps taking the form of a pulse modulated wave. For more information with respect to transforming various desired waveforms into pulse modulated wave representations of the desired waveform, please refer to *Class D Audio Amplifier Design* by Honda et al., International Rectifier, 2003, incorporated herein by reference in its entirety.

In some embodiments, a device similar to or identical to a Maxim Devices MAX4295 integrated circuit may be used to convert a substantially sinusoidal signal into a pulse modulated wave. As a result, a single-voltage supply (e.g., supply 118) may be used to operate the various apparatus 100 disclosed herein, with the total power usage being less than about 50% of that required using a linear amplifier circuit. Sophisticated mounting techniques or heat sinking may therefore not be needed, even when operation at surrounding temperatures of 165° C. and higher are desired.

In some embodiments, the apparatus 100 may include a single-polarity power supply 118 to provide substantially all of the power required by the amplifier 180. In some embodiments, two sets of complementary-conducting switching devices 132 (e.g., the first set may comprise MOSFET 148a and MOSFET 146b, and the second set may comprise MOSFET 148b and MOSFET 146a) may be connected in a bridge circuit, such as an H-bridge circuit, and coupled to the driven element 150, either directly or indirectly. Thus, each set may comprise a substantially equal number of transistors.

In some embodiments, the transformer 128 may be coupled to the driven element 150, either directly, or indirectly (e.g., via MOSFETS 146, 148). The amplifier 180, which may be a switching amplifier, can be used to provide an output signal to the driven element 150, and the amplifier 180 may be operatively selectable between H-bridge operation and non-H-bridge operation. In some embodiments an additional amplifier (not shown) may be coupled between the transformer 128 and/or the amplifier 180 and the driven element 150, depending on the voltage, current, and/or power required to properly drive the driven element 150.

The transformer 128 may be used to couple the gate and the source of one or more of the switching devices 132. In some embodiments, the amplifier 180 may comprise a pseudo ground 186 for operation that is selectable between bridged and non-bridged operation. Many other embodiments may be realized.

For example, in some embodiments, an apparatus 100 may comprise a receiver 188 to receive a signal 184, such as a substantially sinusoidal signal, provided by a driven element 150, such as a magnetostrictive device coupled to a non-atmospheric medium 182, as well as an amplifier 180 having substantially zero quiescent current in the absence of an input signal. In some embodiments, the apparatus 100 may further comprise a PLL 190 to receive the signal 184.

In some embodiments, such as those used in downhole drilling applications, the apparatus 100 may comprise a processor 192 to determine a degree of inclination associated with a downhole tool, indicated by the signal 184 (e.g., see degree of inclination I and downhole tool 224 in FIG. 2, described below). As noted previously, the signal 184 may comprise a frequency of about 20 Hertz to about 20,000 Hertz.

Thus it can be seen that in some embodiments, the amplifier 180 may be designed to drive a driven element 150, such as a magnetostrictive device, which in response produces a signal 184, such as an audio signal. Effectively, the driven element may operate as a physical hammer, sending or propagating the signal 184 along a medium 182, including a mud motor or drill string.

Figure 2:
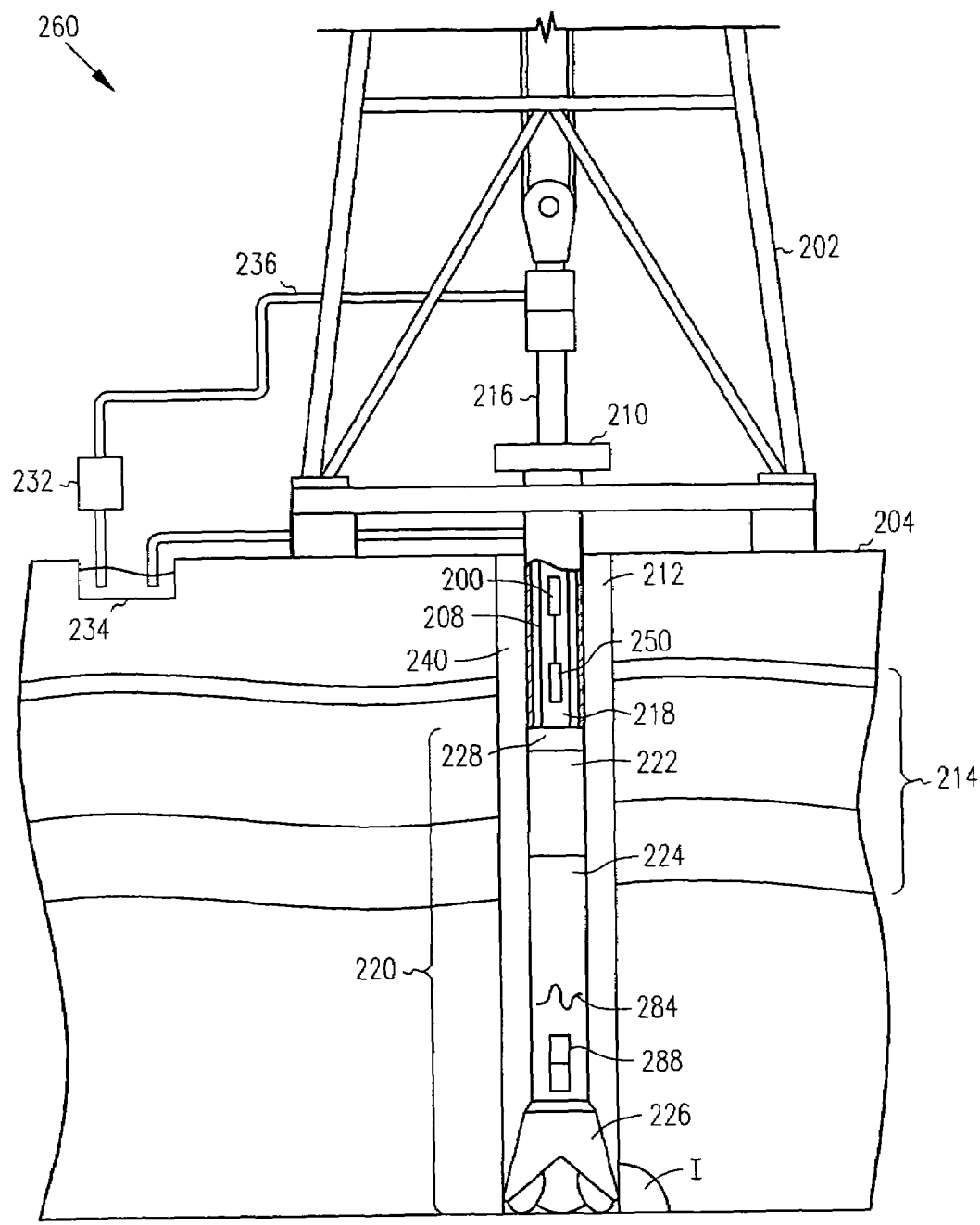
FIG. 2 is an illustration of an apparatus and system according to various embodiments.

FIG. 2 is an illustration of an apparatus 200 and system 260 according to various embodiments, which may comprise portions of a downhole tool as part of a downhole drilling operation. In some embodiments, a system 260 may form a portion of a drilling rig 202 located at a surface 204 of a well 206. The drilling rig 202 may provide support for a drill string 208. The drill string 208 may operate to penetrate a rotary table 210 for drilling a borehole 212 through subsurface formations 214. The drill string 208 may include a Kelly 216, a drill pipe 218, and a bottom hole assembly 220, perhaps located at the lower portion of the drill pipe 218.

The bottom hole assembly 220 may include drill collars 222, a downhole tool 224, and a drill bit 226. The drill bit 226 may operate to create a borehole 212 by penetrating the surface 204 and subsurface formations 214. The downhole tool 224 may comprise any of a number of different types of tools including MWD (measurement while drilling) tools, LWD (logging while drilling) tools, and others.

During drilling operations, the drill string 208 (perhaps including the Kelly 216, the drill pipe 218, and the bottom hole assembly 220) may be rotated by the rotary table 210. In addition to, or alternatively, the bottom hole assembly 220 may also be rotated by a motor 228 (e.g., a mud motor) that is located downhole. The drill collars 222 may be used to add weight to the drill bit 226. The drill collars 222 also may stiffen the bottom hole assembly 220 to allow the bottom hole assembly 220 to transfer the added weight to the drill bit 226, and in turn, assist the drill bit 226 in penetrating the surface 204 and subsurface formations 214.

During drilling operations, a mud pump 232 may pump drilling fluid (sometimes known by those of skill in the art as "drilling mud") from a mud pit 234 through a hose 236 into the drill pipe 218 and down to the drill bit 226. The drilling fluid can flow out from the drill bit 226 and be returned to the surface 204 through an annular area 240 between the drill pipe 218 and the sides of the borehole 212. The drilling fluid may then be returned to the mud pit 234, where such fluid is filtered. In some embodiments, the drilling fluid can be used to cool the drill bit 226, as well as to provide lubrication for the drill bit 226 during drilling operations. Additionally, the drilling fluid may be used to remove subsurface formation 214 cuttings created by operating the drill bit 226.

Referring now to FIGS. 1 and 2, it may be seen that in some embodiments, the system 260 may include a downhole tool 224, as well as one or more apparatus 200, similar to or identical to the apparatus 100 described above and illustrated in FIG. 1. Thus, in some embodiments, the system 260 may comprise an amplifier 180, perhaps having substantially zero quiescent current in the absence of an input signal or input waveform (e.g., waveform 104). The amplifier 180 may be used to receive the input signal, including a pulse modulated wave representing a desired original signal, as described above. The amplifier 180 may be coupled to drive a driven element 150, and in some embodiments, the amplifier 180 may include a pseudo ground 186 to enable selectable bridged and non-bridged operation.

In some embodiments, the system 260 may include a receiver 288 (similar to or identical to the receiver 188 shown in FIG. 1) to receive a signal 284, such as a substantially sinusoidal signal (similar to or identical to the signal 184 shown in FIG. 1). Depending on the placement of the apparatus 200 and the receiver 288, the filtering activity of the medium, which may comprise a non-atmospheric medium (e.g., the mud motor 228 and/or the drill string 208), may operate to propagate the signal 284, which may be termed a "received signal", from the driven element 250 (e.g., similar to or identical to the driven element 150 shown in FIG. 1, and perhaps included as part of the system 260), to the receiver 288. In many embodiments, it is expected that the original, desired signal (which is converted to the input waveform 104 in FIG. 1) will be substantially similar to a substantially sinusoidal signal.

The apparatus 100, 200, input waveform 104, transistors 108, 122, 124, resistors 110, 112, diodes 114, 140, 142, D1, D2, supply voltage 116, power supply 118, capacitors 120, 134, 152, 154, transformer 128, switching devices 132, pseudo grounds 138, 186, MOSFETs 146a, 146b, 148a, 148b, driven elements 150, 250, amplifier 180, medium 182, signals 184, 284, receivers 188, 288, PLL 190, processor 192, drilling rig 202, surface 204, well 206, drill string 208, rotary table 210, borehole 212, subsurface formations 214, Kelly 216, drill pipe 218, bottom hole assembly 220, drill collars 222, downhole tool 224, drill bit 226, motor 228, mud pump 232, mud pit 234, hose 236, annular area 240, system 260, degree of inclination I, and nodes N1, N2, N3 may all be characterized as "modules" herein. Such modules may include hardware circuitry, and/or a processor and/or memory circuits, software program modules and objects, and/or firmware, and combinations thereof, as desired by the architect of the apparatus 100, 200 and systems 260, and as appropriate for particular implementations of various embodiments. For example, in some embodiments, such modules may be included in an apparatus and/or system operation simulation package, such as a software electrical signal simulation package, a power usage and distribution simulation package, a capacitance-inductance simulation package, a power/heat dissipation simulation package, and/or a combination of software and hardware used to simulate the operation of various potential embodiments.

It should also be understood that the apparatus and systems of various embodiments can be used in applications other than for drilling operations, and thus, various embodiments are not to be so limited. The illustrations of apparatus 100, 200 and systems 260 are intended to provide a general understanding of the structure of various embodiments, and they are not intended to serve as a complete description of all the elements and features of apparatus and systems that might make use of the structures described herein.

Applications that may include the novel apparatus and systems of various embodiments include electronic circuitry used in high-speed computers, communication and signal processing circuitry, modems, processor modules, embedded processors, data switches, and application-specific modules, including multilayer, multi-chip modules. Such apparatus and systems may further be included as sub-components within a variety of electronic systems, such as televisions, cellular telephones, personal computers, workstations, radios, video players, vehicles, and others. Some embodiments include a number of methods.

Figure 3:
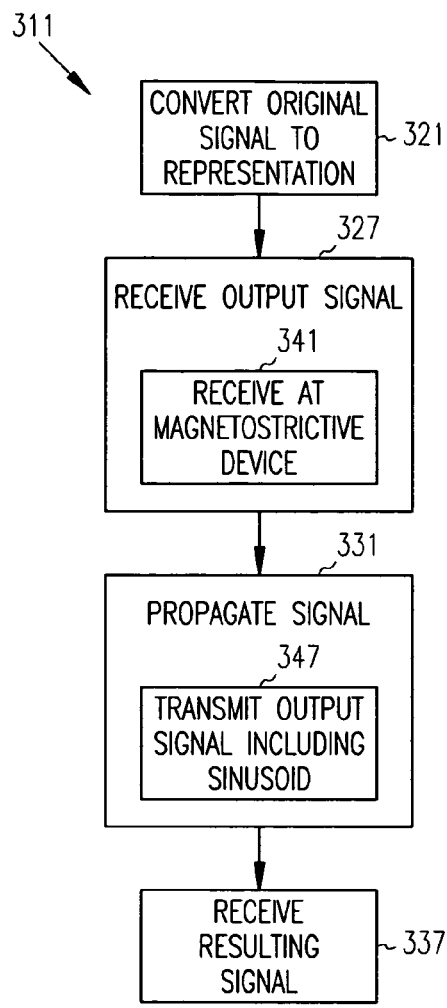
FIG. 3 is a flow chart illustrating several methods according to various embodiments.

For example, FIG. 3 is a flow chart illustrating several methods according to various embodiments. In some embodiments of the invention, a method 311 may (optionally) begin at block 321 with converting an original signal into another signal, such as a pulse modulated wave representing the original signal. The method 311 may include receiving, at a driven component, an output signal provided by an amplifier (e.g., having substantially zero quiescent current in the absence of an input signal and driven by the pulse modulated wave) at block 327, and propagating the output signal, perhaps filtered or otherwise transformed into a substantially sinusoidal signal, in a non-atmospheric medium, such as a mud motor and/or a drill string at block 331. Thus, the method 311 may include receiving a resulting signal (perhaps substantially similar to the original signal and propagated by the driven component and the non-atmospheric medium coupled to it) at block 337.

In some embodiments, the original signal may be selected from one of a sinusoidal signal, a triangular signal, and a sawtooth signal. In some embodiments, the driven component may comprise an inductor and/or a magnetostrictive device, as noted above. Therefore, receiving at block 327 may further include receiving the output signal at a magnetostrictive device at block 341. Many variations of the method 311 are possible.

For example, in some embodiments, the method 311 may include receiving a resulting signal, such as a substantially sinusoidal signal provided by a magnetostrictive device coupled to a non-atmospheric medium and an amplifier (perhaps having substantially zero quiescent current in the absence of an input signal) at block 331. The amplifier may be used to receive a pulse modulated wave comprising an original signal substantially similar to a substantially sinusoidal signal, as noted previously. In some embodiments, the amplifier, which may comprise a switching amplifier, may comprise one of a Class-D amplifier, a Class-E amplifier, and a Class-S amplifier.

The substantially sinusoidal signal, as a desired original signal, or as a resulting signal, may comprise a frequency of about 20 Hertz to about 20,000 Hertz in some embodiments. As noted above, the substantially sinusoidal signal may be used to indicate a degree of inclination associated with at least a portion of a drilling apparatus. The method 311 may also include, as part of propagating the output signal at block 331, transmitting a substantially sinusoidal signal as a portion of an output signal of the amplifier at block 347.

It should be noted that the methods described herein do not have to be executed in the order described, or in any particular order. Moreover, various activities described with respect to the methods identified herein can be executed in serial or parallel fashion. Information, including parameters, commands, operands, and other data, can be sent and received in the form of one or more carrier waves.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. The programs may be structured in an object-orientated format using an object-oriented language such as Java or C++. Alternatively, the programs can be structured in a procedure-orientated format using a procedural language, such as assembly or C. The software components may communicate using any of a number of mechanisms well known to those skilled in the art, such as application program interfaces or interprocess communication techniques, including remote procedure calls. The teachings of various embodiments are not limited to any particular programming language or environment. Thus, other embodiments may be realized.

Figure 4:
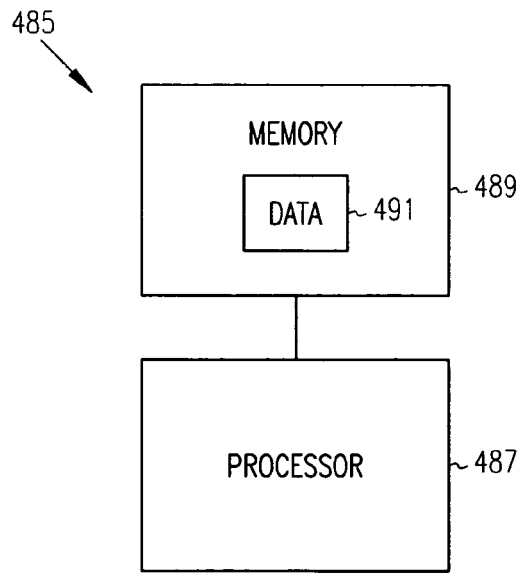
FIG. 4 is a block diagram of an article according to various embodiments.

FIG. 4 is a block diagram of an article according to various embodiments, such as a computer, a memory system, a magnetic or optical disk, some other storage device, and/or any type of electronic device or system. The article 485 may include a processor 487 coupled to a machine-accessible medium such as a memory 489 (e.g., removable storage media, as well as any memory including an electrical, optical, or electromagnetic conductor) having associated information 491 (e.g., computer program instructions and/or data), which when accessed, results in a machine (e.g., the processor 487) performing such actions as receiving a substantially sinusoidal signal provided by a driven component coupled to a non-atmospheric medium and an amplifier having substantially zero quiescent current in the absence of an input signal. As noted above, the amplifier may be used to receive a pulse modulated wave comprising an original signal substantially similar to the substantially sinusoidal signal. In some embodiments, the substantially sinusoidal signal may comprise a frequency of about 20 Hertz to about 20,000 Hertz, and be used to indicate a degree of inclination associated with at least a portion of a drilling apparatus. Many variations are possible. For example, in some embodiments, further actions may include transmitting the substantially sinusoidal signal as a portion of an output signal of the amplifier, among others.

Reduced current consumption, which may be desirable for battery-powered operation and in those circumstances where relatively high-temperatures are present, may result from implementing the apparatus, systems, and methods disclosed herein. Some embodiments may operate from a single-voltage supply, providing greater efficiency, a reduced component count, and the ability to amplify signals without a sleep mode or separate physical heat sinking at temperatures of 165 C and above.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus, including:
    an amplifier having substantially zero quiescent current in the absence of an input signal to receive a pulse modulated wave comprising a representation of an original signal, the amplifier to drive a driven element to couple to a non-atmospheric medium to filter and propagate a received signal substantially similar to the original signal.

2. The apparatus of claim 1, further comprising:
    a single-polarity power supply to provide substantially all of the power required by the amplifier.

3. The apparatus of claim 1, further comprising:
    two sets of complementary-conducting switching devices connected in a bridge circuit and coupled to the driven element.

4. The apparatus of claim 3, wherein each set comprises a substantially equal number of transistors.

5. The apparatus of claim 1, further comprising:
    a transformer coupled to the driven element.

6. The apparatus of claim 5, wherein the amplifier is to provide an output signal to the driven element selectable between H-bridge operation and non-H-bridge operation.

7. The apparatus of claim 5, wherein the transformer is to couple a gate and a source of at least one of the switching devices.

8. An apparatus, comprising:
    a receiver to receive a substantially sinusoidal signal provided by a magnetostrictive device coupled to a non-atmospheric medium and an amplifier having substantially zero quiescent current in the absence of an input signal, wherein the amplifier is to receive a pulse modulated wave comprising an original signal substantially similar to the substantially sinusoidal signal.

9. The apparatus of claim 8, further comprising:
a phase-locked loop to receive the substantially sinusoidal signal.

10. The apparatus of claim 8, further comprising:
a processor to determine a degree of inclination associated with a downhole tool and indicated by the substantially sinusoidal signal.

11. The apparatus of claim 8, wherein the substantially sinusoidal signal comprises a frequency of about 20 Hertz to about 20,000 Hertz.

12. A system, comprising:
an amplifier having substantially zero quiescent current in the absence of an input signal to receive a pulse modulated wave representing an original signal and to drive a driven element;
a receiver to receive a substantially sinusoidal signal, wherein the original signal is substantially similar to the substantially sinusoidal signal; and
a non-atmospheric medium to propagate the received signal from the driven element to the receiver.

13. The system of claim 12, wherein the non-atmospheric medium comprises at least one of a mud motor and a drill string.

14. The system of claim 12, further comprising:
the driven element comprising an inductor.

15. The system of claim 12, further comprising:
the driven element including a magnetostrictive sensor.

16. The system of claim 12, wherein the amplifier comprises:
a pseudo ground to enable selecting bridged and non-bridged operation.

17. A method, comprising:
converting an original signal into a pulse modulated wave representing the original signal;
receiving, at a driven component, an output signal provided by an amplifier having substantially zero quiescent current in the absence of an input signal and driven by the pulse modulate wave; and
receiving a resulting signal substantially similar to the original signal and propagated by the driven component by way of a non-atmospheric medium coupled to the driven component.

18. The method of claim 17, wherein the original signal is selected from one of a sinusoidal signal, a triangular signal, and a sawtooth signal.

19. The method of claim 17, wherein the driven component comprises an inductor.

20. The method of claim 17, wherein receiving further includes:
receiving the output signal at a magnetostrictive device.

21. A method, including:
receiving a substantially sinusoidal signal provided by a magnetostrictive device coupled to a non-atmospheric medium and an amplifier having substantially zero quiescent current in the absence of an input signal, wherein the amplifier is to receive a pulse modulated wave comprising an original signal substantially similar to the substantially sinusoidal signal.

22. The method of claim 21, wherein the amplifier comprises one of a Class-D amplifier, a Class-E amplifier, and a Class-S amplifier.

23. The method of claim 21, further including:
propagating the substantially sinusoidal signal in the non-atmospheric medium comprising at least one of a mud motor and a drill string.

24. The method of claim 21, wherein the substantially sinusoidal signal comprises a frequency of about 20 Hertz to about 20,000 Hertz.

25. An article comprising a machine-accessible medium having associated information, wherein the information, when accessed, results in a machine performing:
receiving a substantially sinusoidal signal provided by a driven component coupled to a non-atmospheric medium and an amplifier having substantially zero quiescent current in the absence of an input signal, wherein the amplifier is to receive a pulse modulated wave comprising an original signal substantially similar to the substantially sinusoidal signal.

26. The article of claim 25, wherein the substantially sinusoidal signal comprises a frequency of about 20 Hertz to about 20,000 Hertz.

27. The article of claim 25, wherein the substantially sinusoidal signal is to indicate a degree of inclination associated with at least a portion of a drilling apparatus.

28. The article of claim 25, wherein the information, when accessed, results in the machine performing:
transmitting the substantially sinusoidal signal as a portion of an output signal of the amplifier.

* * * * *